United States Patent [19]
Yoshida

[11] Patent Number: 5,182,471
[45] Date of Patent: Jan. 26, 1993

[54] HYSTERESIS COMPARATOR
[75] Inventor: Yoshihiro Yoshida, Yokohama, Japan
[73] Assignee: Kabushiki Kaisha Toshiba, Kawasaki, Japan
[21] Appl. No.: 687,740
[22] Filed: Apr. 19, 1991
[30] Foreign Application Priority Data
  Apr. 21, 1990 [JP] Japan .................................. 2-105910
[51] Int. Cl.$^5$ ............................................. H03K 5/22
[52] U.S. Cl. .................... 307/355; 307/357; 307/364
[58] Field of Search ................. 307/355, 356, 357, 364
[56] References Cited
U.S. PATENT DOCUMENTS

| 4,456,887 | 6/1984 | Tokumo | 330/261 |
| 4,564,281 | 1/1986 | Takemae | 307/357 |
| 4,587,444 | 5/1986 | Emori et al. | 307/356 |

Primary Examiner—Eugene R. LaRoche
Assistant Examiner—R. A. Ratliff
Attorney, Agent, or Firm—Banner, Birch, McKie & Beckett

[57] ABSTRACT

In a hysteresis comparator for comparing an input Vin1 with another input Vin2, the comparator comprises a pair of first and second transistors. The gate of the first transistor is supplied with the input Vin1 and the gate of the second transistor is supplied with the input Vin2. Their collectors are connected to a power supply. The emitter of the first transistor is connected to a first current source and the emitter of the second transistor is connected to a second current source. The comparator further comprises a circuit for detecting an emitter voltage difference between the first and second transistors and varying at least one of the first and second current sources. Therefore, the hysteresis width can be determined by the collector current ratio of specific transistors, regardless of the absolute values of their collector currents.

21 Claims, 7 Drawing Sheets

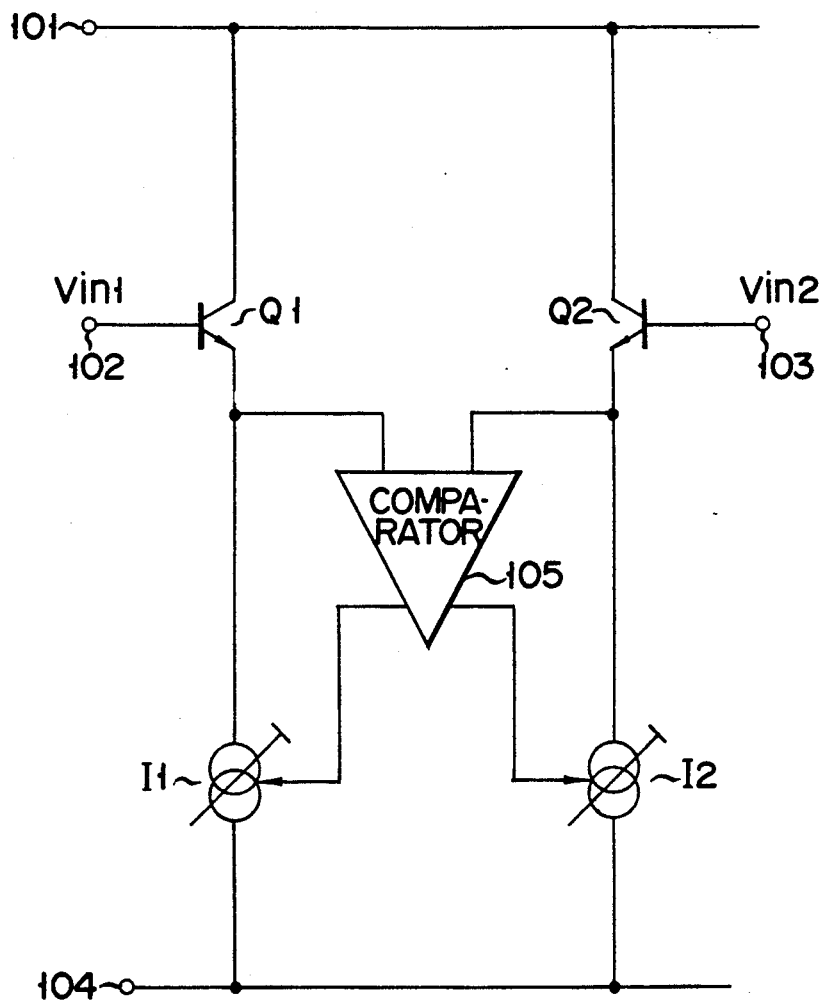
F I G. 2

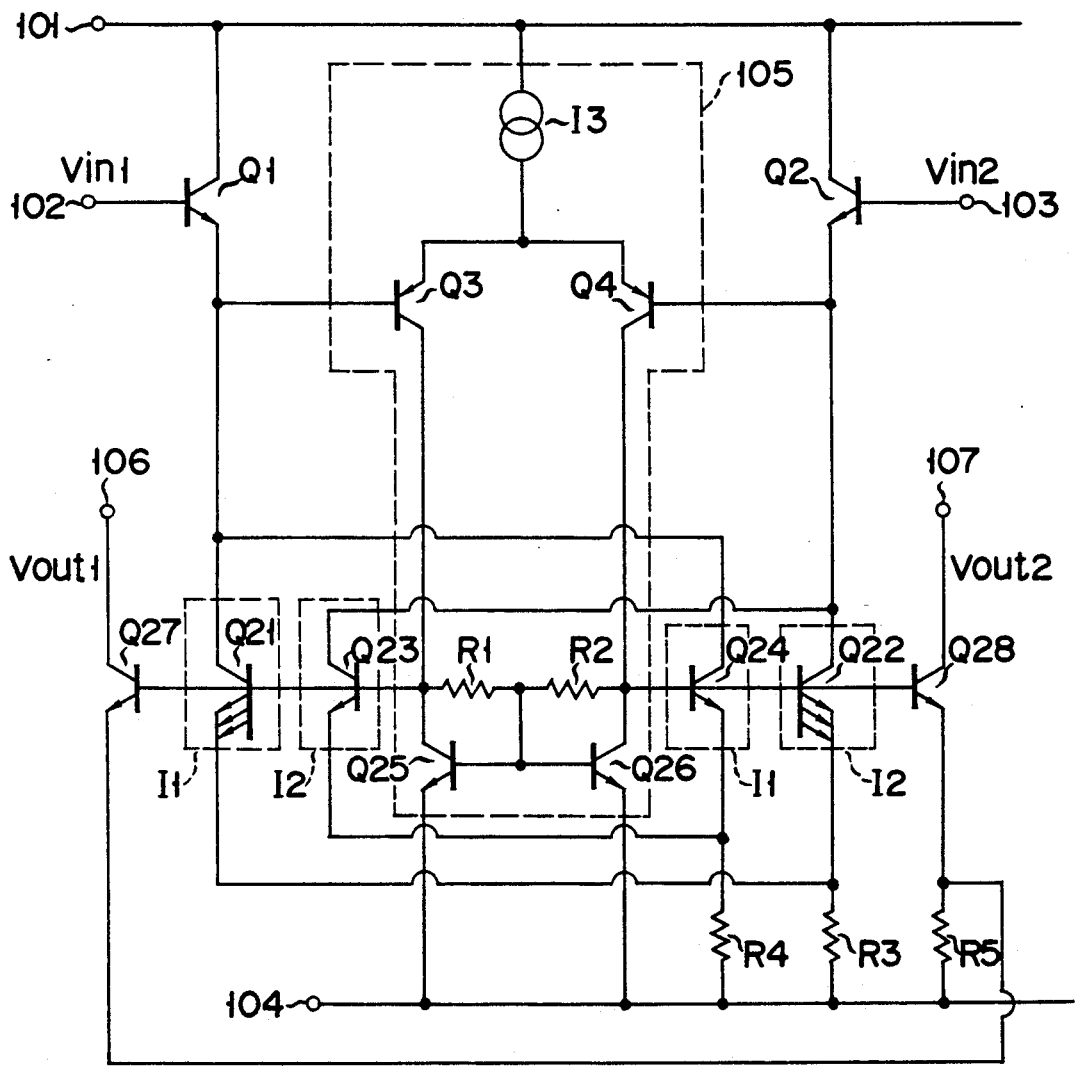
F I G. 3

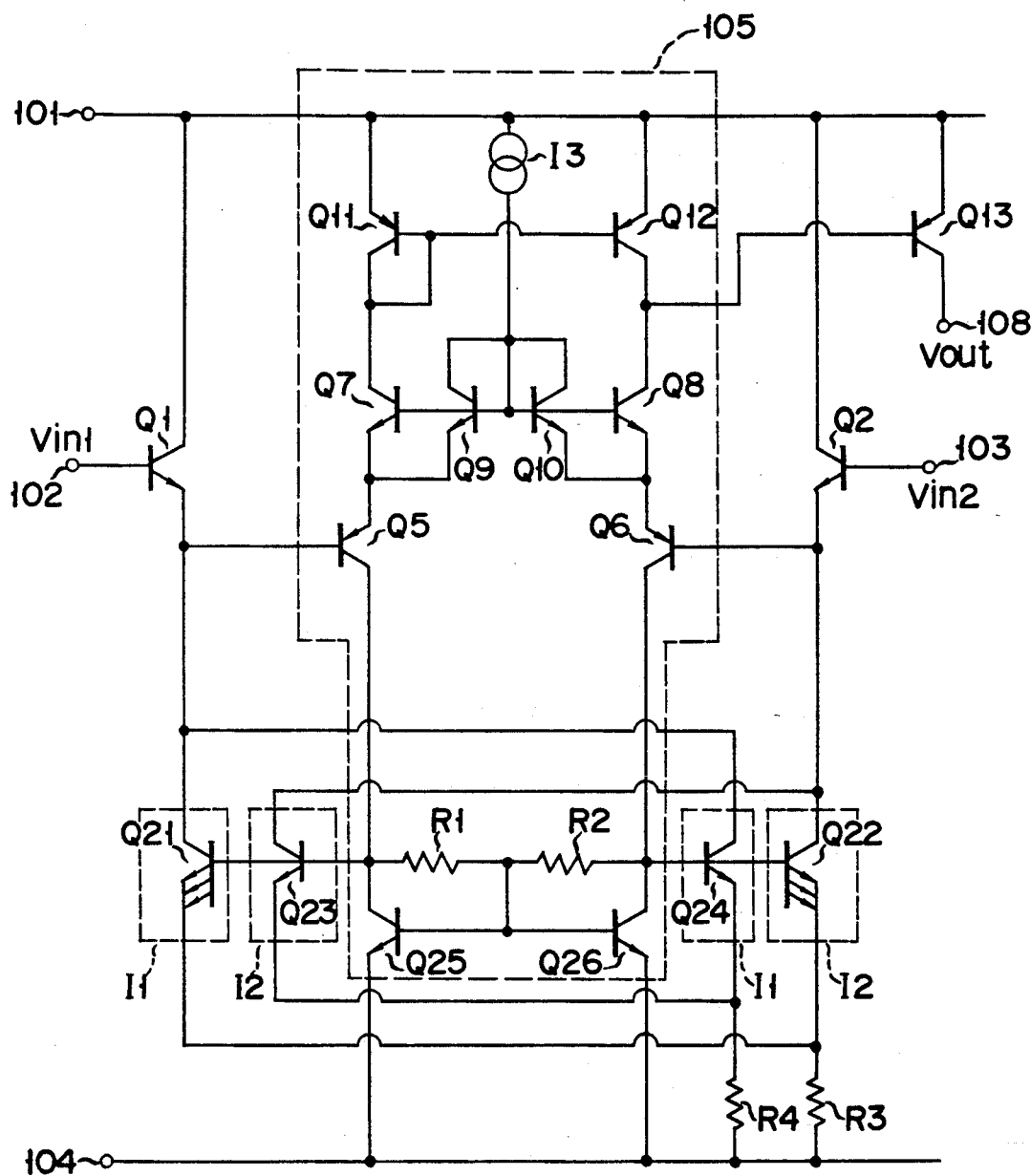
F I G. 5

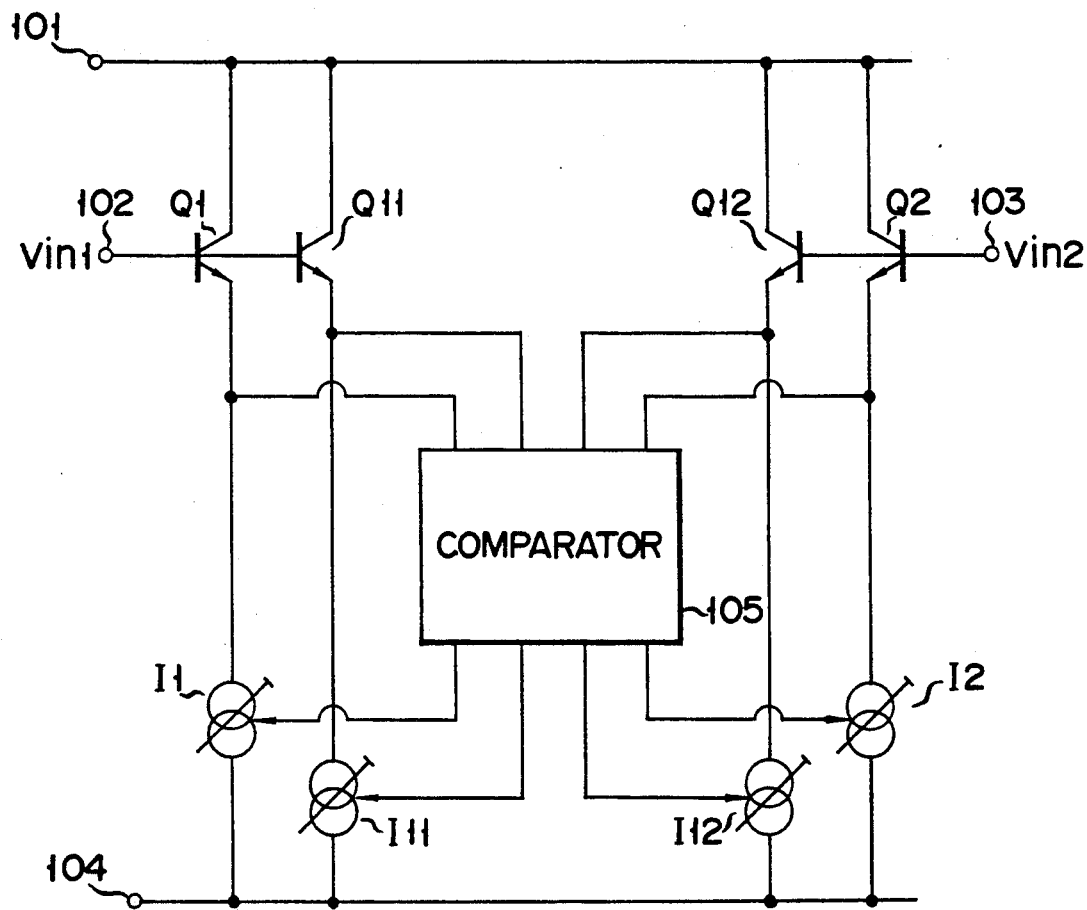
F I G. 6

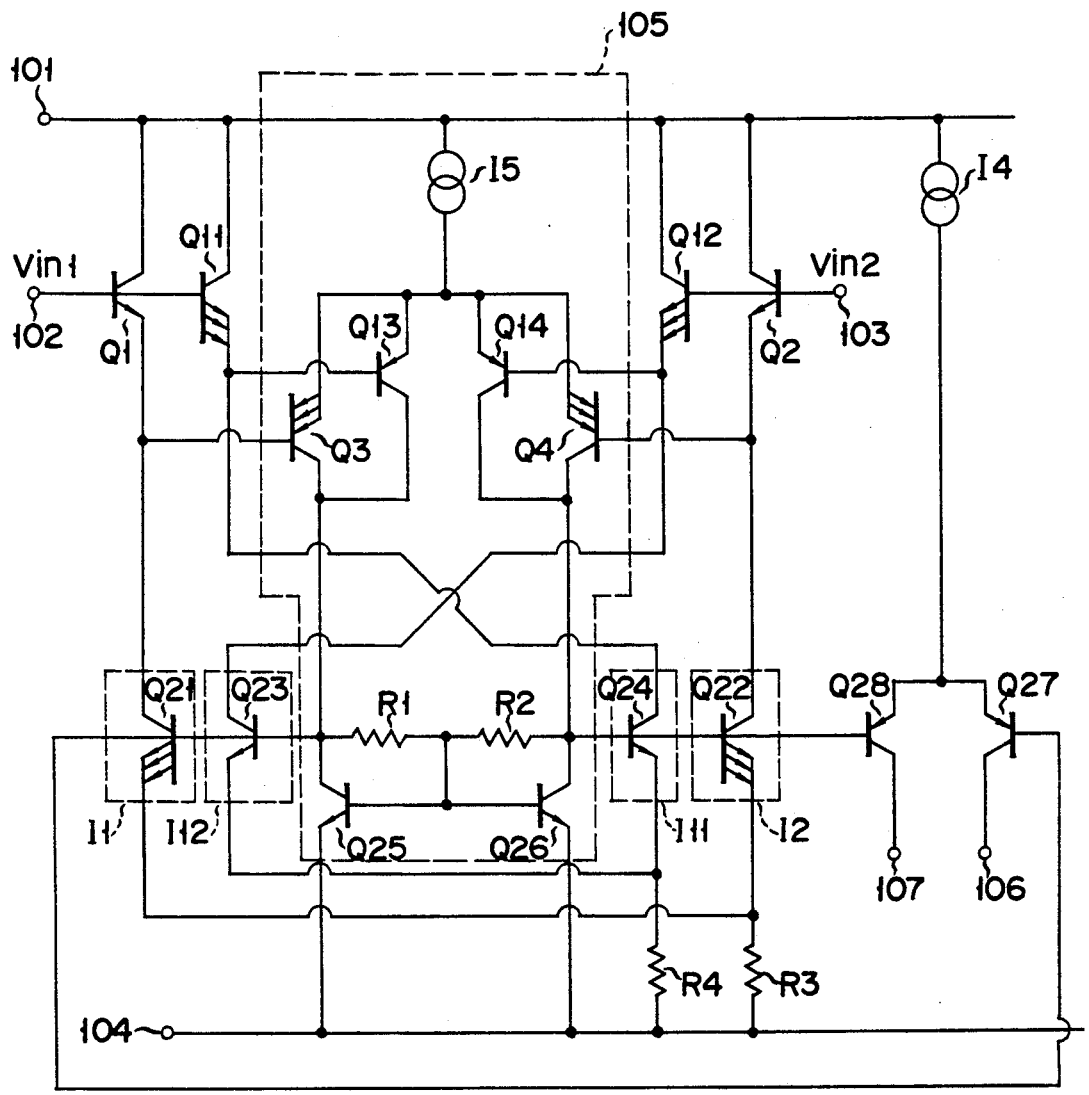
F I G. 7

HYSTERESIS COMPARATOR

BACKGROUND OF THE INVENTION

1. Field of the Invention

This invention relates to a hysteresis comparator, and more particularly to a hysteresis comparator with a small hysteresis width that allows two-terminal input.

2. Description of the Related Art

Published Examined Japanese Patent Application No. 53-17029 discloses a conventional hysteresis comparator characterized by having a small hysteresis width and allowing two-terminal input. The phrase "hysteresis width" is used in the specification to means a voltage difference between a value of an input voltage in which a state of an output voltage is inverted and another value of the input voltage in which another state of the output voltage is inverted. Such a hysteresis comparator has problems with the stability of hysteresis width and the operating regions of circuit elements. These two problems will be explained briefly, referring to FIG. 1.

With the hysteresis-width stability problem, increasing the area ratio $N_1$ of p-n-p transistors Q62 to Q61 and the area ratio $N_2$ or p-n-p transistor Q72 to Q71 results in the change of the hysteresis width by the increased amount of base currents flowing through these p-n-p transistors Q61, Q62, Q71, and Q72. The same holds true even if those area ratios are relatively small, for example, $N_1=2$ and $N_2=2$. For IC fabrication, p-n-p transistors Q61, Q62, Q71, and Q72 must be fabricated in lateral structure, resulting in a small current gain $h_{FE}$. The small current gain makes it difficult to control the collector current, leading to the unstable hysteresis width. If p-n-p transistors Q61, Q62, Q71, and Q72 are replaced with n-p-n transistors, this requires input transistors Q51 and Q52 to be lateral p-n-p transistors, which raises an input current problem.

With the operating region problem, the operation of p-n-p transistors Q62 and Q72 in the saturation region is not only undesirable for faster operation and but also liable to develop parasitic elements.

As mentioned above, while conventional hysteresis comparators feature two-terminal input and their small 1 hysteresis width, they have problems with the stability of hysteresis width and the operating regions of circuit elements.

SUMMARY OF THE INVENTION

Accordingly, the object of the present invention is to provide a hysteresis comparator that allows differential input (such as two-terminal input), has a small stable hysteresis width, and permits all circuit elements to operate in their active operating regions.

The foregoing object is accomplished in one embodiment of the present invention by a hysteresis comparator, comprising: a first transistor which has its collector connected to a first power supply terminal, its base connected to a first input terminal, and its emitter connected to a second power supply terminal via a first current source; a second transistor which has its collector connected to the first power supply terminal, its base connected to a second input terminal, and its emitter connected to the second power supply terminal via a second current source; and sensing and varying means for sensing the emitter voltage difference between the first and second transistors and based on the sensed result, varying at least one of the first and second current sources.

The same object is also accomplished in another embodiment according to the present invention by a hysteresis comparator, comprising: a first transistor which has its collector connected to a first power supply terminal, its base connected to a first input terminal, and its emitter connected to a second power supply terminal via a first current source; a second transistor which has its collector connected to the first power supply terminal, its base connected to the first input terminal, and its emitter connected to the second power supply terminal via a second current source; a third transistor which has its collector connected to the first power supply terminal, its base connected to a second input terminal, and its emitter connected to the second power supply terminal via a third current source; a fourth transistor which has its collector connected to the first power supply terminal, its base connected to the second input terminal, and its emitter connected to the second power supply terminal via a fourth current source; and sensing and varying means for sensing the emitter voltage difference between the first through fourth transistors and based on the sensed result, varying at least one of the first through fourth current sources.

In the former embodiment, at least one of the first and second current sources is variable based on the emitter voltage difference between the first and second transistors, while in the latter embodiment, at least one of the first through fourth current sources is variable based on the emitter voltage difference between the first through fourth transistors. Therefore, a hysteresis comparator according to either of these embodiments not only provides a stable hysteresis width but also allows all circuits elements to operate in their active regions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram for a hysteresis comparator according to a first embodiment of the present invention;

FIG. 3 is a circuit diagram showing a concrete composition of the hysteresis comparator of FIG. 2;

FIG. 5 is a circuit diagram illustrating another composition of the hysteresis comparator of FIG. 2;

FIG. 6 is a circuit diagram for a hysteresis comparator in accordance with a second embodiment of the present invention; and FIG. 7 is a circuit diagram showing a concrete arrangement of the hysteresis comparator in FIG. 6.

DETAILED DESCRIPTION OF THE PREFERRED EMBODIMENTS

Figure 1:
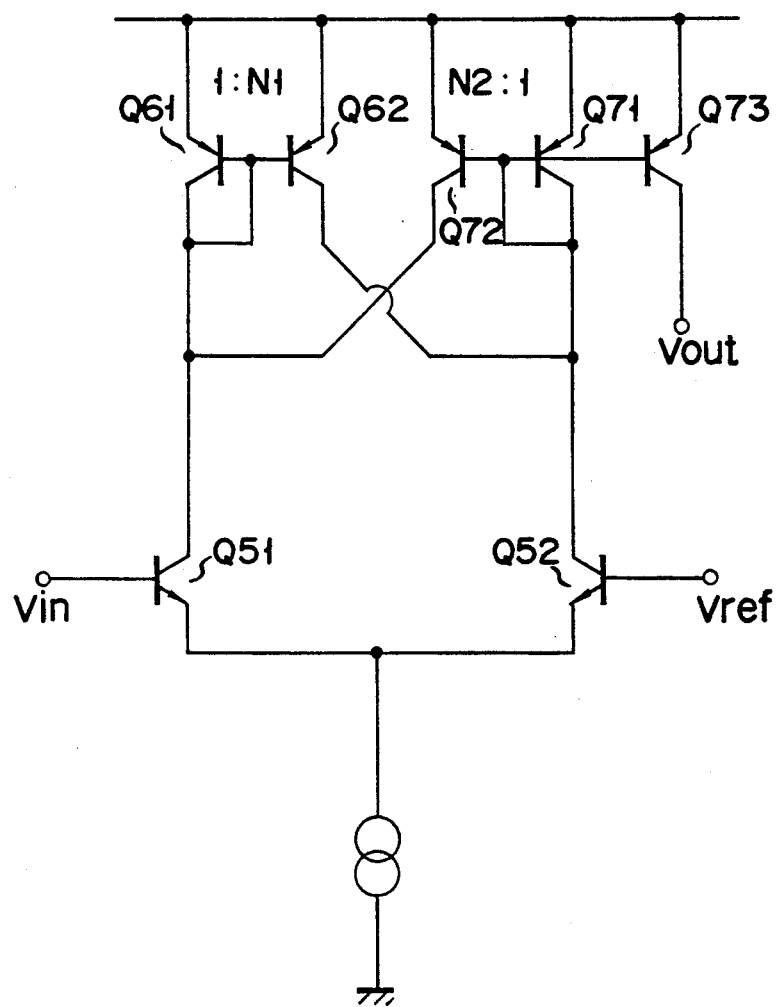
FIG. 1 is a circuit diagram of a conventional hysteresis comparator.

Referring to the accompanying drawings, embodiments of the present invention will be now explained in detail.

FIG. 2 is a circuit diagram for a hysteresis comparator according to a first embodiment of the present invention.

An n-p-n transistor Q1 (a first transistor) has its collector connected to a first power supply terminal 101 and its base connected to a first input terminal 102. An n-p-n transistor Q2 (a second transistor) has its collector connected to a first power supply terminal 101 and its base connected to a second input terminal 103. The emitter of the transistor Q1 is connected to a second power supply terminal 104 via a first current source $I_1$, while the emitter of the transistor Q2 is connected to a second power supply terminal 104 via a second current source $I_2$. The emitters of transistors Q1 and Q2 are each connected to a comparator 105. The comparator 105, which senses the difference between the input voltages $V_{IN1}$ and $V_{IN2}$ for transistors Q1 and Q2, or the emitter voltage difference between transistors Q1 and Q2, can vary at least one of the first and second current sources $I_1$ and $I_2$.

Namely, the hysteresis comparator of FIG. 2 is characterized in that the emitter currents flowing through the n-p-n transistors Q1 and Q2 connected to the first and second input terminals 102 and 103 in emitter follower form are controlled so as to produce a specified offset voltage between the first and second input terminals 102 and 103.

FIG. 3 is a circuit diagram showing a concrete construction of the hysteresis comparator of FIG. 2.

The comparator 105 is composed of a third current source $I_3$, p-n-p transistors Q3 and Q4, n-p-n transistors Q25 and Q26, and resistors $R_1$ and $R_2$. Specifically, the p-n-p transistors Q3 (a third transistor) and Q4 (a fourth transistor) have their emitters connected to each other and their connecting point is then coupled with the first power supply terminal 101 via the third current source $I_3$. The base of transistor Q3 is connected to the emitter of transistor Q1, whereas the base of transistor Q4 is connected to the emitter of transistor Q2. The transistors Q3 and Q4 and the current source $I_3$ constitute a differential amplifier. The collectors of transistors Q25 and Q26 are connected to the collectors of transistors Q3 and Q4, respectively. The emitters of transistors Q25 and Q26 are both connected to the second power supply terminal 104. The transistors Q25 and Q26 have their bases connected to each other and their connecting point is connected to the collector of the transistor Q25 via the resistor $R_1$ and to the collector of the transistor Q26 via the resistor $R_2$.

The first current source $I_1$ is comprised of n-p-n transistors Q21 and Q24, while the second current source $I_2$ is composed of n-p-n transistors Q22 and Q23. Specifically, the bases of transistors Q21 and Q23 are both connected to the collectors of transistor Q3 and Q25, whereas the bases of transistors Q22 and Q24 are both connected to the collectors of transistors Q4 and Q26. The transistors Q21 and Q24 have their collectors connected to one another and their connecting point is coupled with the emitter of the transistor Q1, whereas the transistors Q22 and Q23 have their collectors connected to one another and their connecting point is coupled with the emitter of the transistor Q2. The transistors Q2 and Q22 have their emitters connected to each other and their connecting point is coupled with the second power supply terminal via a resistor $R_3$, while the transistors Q23 and Q24 have their emitters connected to one another and their connecting point is coupled with the second power supply terminal 104 via a resistor $R_4$.

The transistor Q27 has its base connected to both bases of transistors Q21 and Q23 and its collector to a first output terminal 106, whereas the transistor Q28 has its base connected to both bases of transistors Q22 and Q24 and its collector to a second output terminal 107. The transistors Q27 and Q28 have their emitters connected to each other and their connecting point is coupled with the second power supply terminal 104.

The transistors Q25 and Q26 have their bases connected to one another. The resistor $R_1$ is connected across the base and collector of the transistor Q25, while the resistor $R_2$ is connected across the base and collector of the transistor Q26. The bases of transistors Q27, Q21, and Q3 are connected via the resistors $R_1$ and $R_2$ with the bases of transistors Q24, Q2, and Q28.

The operation of the hysteresis comparator is now explained in detail, referring to FIG. 3.

In a case where the relationship of the voltage $V_{IN1}$ applied to the first input terminal 102 and the voltage $V_{IN2}$ applied to the second input terminal 103 is $V_{IN1} << V_{IN2}$, the differential amplifier composed of transistors Q3 and Q4 puts transistors Q21 and Q23 in the on state and transistors Q22 and Q24 in the off state, because the transistor Q3 is in the on state.

If the ratio of transistor Q21's collector current $I_{C(Q21)}$ to transistor Q23's collector current $I_{C(Q23)}$ is $I_{C(Q21)}:I_{C(Q23)}=3:1$, for example, then the first current source $I_1$ will carry the amount of current three times that flowing through the second current source $I_2$.

Therefore, the base-to-emitter voltage $V_{BE(Q1)}$ of the transistor Q1 will be:

$$V_{BE(Q1)} = V_T \ln \frac{I_{C(Q21)}}{I_s}$$

The base-to-emitter voltage $V_{BE(Q2)}$ of the transistor Q2 will be:

$$V_{BE(Q2)} = V_T \ln \frac{I_{C(Q23)}}{I_s}$$

$$\text{in which } V_T = \frac{kT}{q}$$

where k is the Boltzmann constant, T absolute temperature, q the amount of charge, and $I_S$ saturation current.

Thus, the base-to-emitter voltage difference $V_{BE(Q1-Q2)}$ between transistors Q1 and Q2 will be:

$$\begin{aligned} V_{BE(Q1-Q2)} &= V_{BE(Q1)} - V_{BE(Q2)} \\ &= V_T \ln \frac{I_{C(Q21)}}{I_{C(Q23)}} \\ &= V_T \ln 3 \approx 28.6 \text{ mV} \end{aligned}$$

Since the base-to-emitter voltage $V_{BE(Q1)}$ of the transistor Q1 is approximately 28.6 mV larger than the base-to-emitter voltage $V_{BE(Q2)}$ of the transistor Q2, the levels of output voltages $V_{OUT1}$ and $V_{OUT2}$ will not be reversed unless the input voltage $V_{IN1}$ applied to the Q1's base meets the following condition:

$$V_{IN1} > V_{IN2} + 28.6 \, mV \tag{1}$$

On the other hand, under the condition of $V_{IN1} >> V_{IN2}$, the differential amplifier comprised of transistors Q3 and Q4 puts transistors Q22 and Q24 in the on state and transistors Q21 and Q23 in the off state, because the transistor Q4 is in the on state.

If the ratio of transistor Q22's collector current $I_{C(Q22)}$ to transistor Q24's collector current $I_{C(Q24)}$ is $I_{C(Q22)}:I_{C(Q24)} = 3:1$, for example, then the second current source $I_2$ will carry the amount of current three times that flowing through the first current source $I_1$.

Therefore, the base-to-emitter voltage $V_{BE(Q1)}$ of the transistor Q1 will be:

$$V_{BE(Q1)} = V_T l_n \frac{I_{c(Q24)}}{I_s}$$

The base-to-emitter voltage $V_{BE(Q2)}$ of the transistor Q2 will be:

$$V_{BE(Q2)} = V_T l_n \frac{I_{c(Q22)}}{I_s}$$

Thus, the base-to-emitter voltage difference $V_{BE(Q2-Q1)}$ between transistors Q2 and Q1 will be:

$$\begin{aligned} V_{BE(Q2-Q1)} &= V_{BE(Q2)} - V_{BE(Q1)} \\ &= V_T l_n \frac{I_{c(Q22)}}{I_{c(Q24)}} \\ &= V_T l_n 3 \approx 28.6 \, mV \end{aligned}$$

Since the base-to-emitter voltage $V_{BE(Q2)}$ of the transistor Q2 is nearly 28.6 mV larger than the base-to-emitter voltage $V_{BE(Q1)}$ of the transistor Q1, the levels of output voltages $V_{OUT1}$ and $V_{OUT2}$ will not be inverted unless the input voltage $V_{IN2}$ applied to the Q2's base fulfills the following condition:

$$V_{IN2} > V_{IN1} + 28.6 \, mV \tag{2}$$

Figure 4:
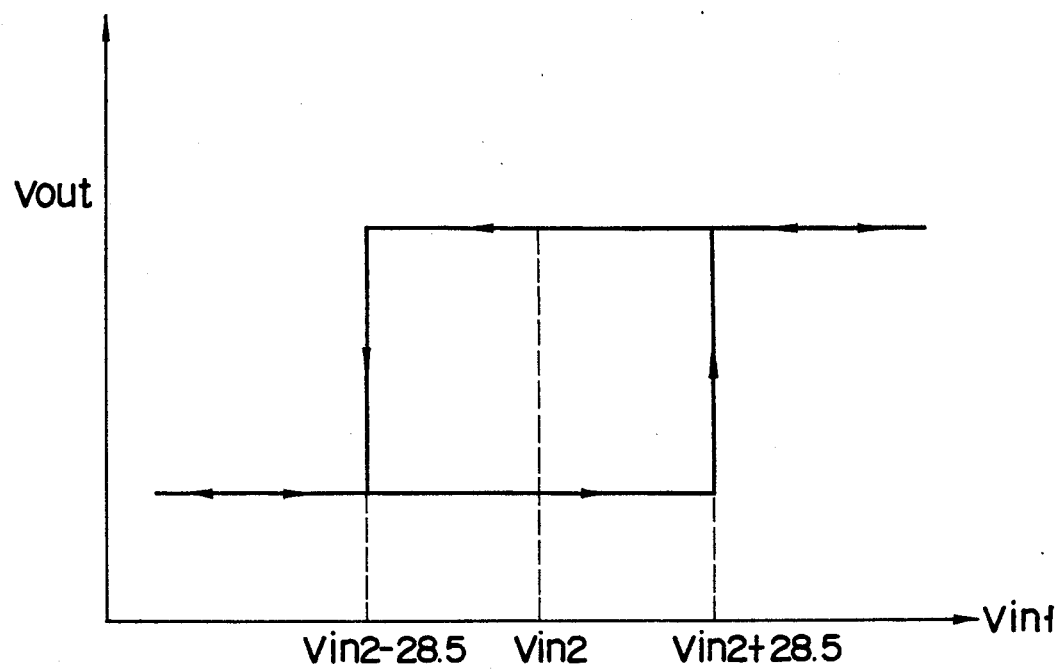
FIG. 4 is an operating characteristic diagram for the hysteresis comparator of FIG. 3.

Based on the expressions (1) and (2), it can be seen that a hysteresis loop is obtained as shown FIG. 4, by using the voltage $V_{IN1}$ applied to the transistor Q1's base as a parameter, in which the hysteresis width is denoted by the voltage difference between the input voltage ($V_{IN2}+28.5$) in which the state of the output voltage is inverted and the input voltage ($V_{IN2}-28.5$) in which the state of the output voltage is inverted.

The hysteresis width is determined by both the current ratio of the transistor Q21's collector current $I_{C(Q21)}$ to the transistor Q23's collector current $I_{C(Q23)}$ ($I_{C(Q21)}:I_{C(Q23)}$) and the current ratio of the transistor Q22's collector current $I_{C(Q22)}$ to the transistor Q24's collector current $I_{C(Q24)}$ ($I_{C(Q22)}:I_{C(Q24)}$). That is, changing each of these two current ratios makes it possible to change the voltage at which the state is inverted.

With such a configuration, in addition to differential input (e.g., two-terminal input) and a small hysteresis width, the hysteresis comparator provides a stable hysteresis width (or less dependence on the transistor's current gain $h_{FE}$). As described above, what determines the hysteresis width is the collector current ratio of transistors Q21 to Q23 and the collector current ratio of transistors Q22 to Q24 but has nothing to do with the absolute values of those currents. In connection with this, although the absolute current values of transistors Q21 through Q24 vary with the current gain $h_{FE}$ of n-p-n transistors, it is possible to reduce variations in their resistance ratio and area ratio to a minimum, thereby accomplishing the stable hysteresis width. Moreover, in this arrangement, all circuit elements operate in the active regions, which not only speeds up circuit operation but also makes it difficult for parasitic elements to develop.

FIG. 5 is a circuit diagram for another composition of the hysteresis comparator in FIG. 2. Like parts are indicated by like reference characters in FIGS. 5 and 3 and their explanation will be omitted.

The emitter of a p-n-p transistor Q5 (a third transistor) is connected to both the emitters of n-p-n transistors Q7 (a fifth transistor) and Q9, whereas the emitter of a p-n-p transistor Q6 (a fourth transistor) is connected to both the emitters of n-p-n transistors Q8 (a sixth transistor) and Q10. The bases of the transistors Q7 through Q10 and the collectors of the transistors Q9 and Q10 are connected to one another and their connecting point is coupled with the first power supply terminal 101 via the third current source $I_3$. The collector of the transistor Q7 is connected to both the base and collector of a p-n-p transistor Q11, while the collector of the transistor Q8 is connected to the collector of a p-n-p transistor Q12. The transistors Q11 and Q12 have their bases connected to each other and their emitters both connected to the first power supply terminal 101. The collectors of the transistors Q8 and Q12 are connected to the base of a transistor Q13. The p-n-p transistor Q13 has its emitter connected to the first power supply terminal 101 and its collector to the output terminal 108.

With this arrangement, the hysteresis comparator has the same effect as that of FIG. 3.

FIG. 6 is a circuit diagram for a hysteresis comparator according to a second embodiment of the present invention.

The n-p-n transistors Q1 (a first transistor) and Q11 (a second transistor) have their collectors both connected to a first power supply terminal 101 and their bases both connected to a first input terminal 102. The n-p-n transistors Q2 (a third transistor) and Q12 (a fourth transistor have their collectors both connected to the first power supply terminal 101 and their bases both connected to a second input terminal 103. The emitter of the transistor Q1 is connected to a second power supply terminal 104 via a first current source $I_1$, while the emitter of the n-p-n transistor Q11 is connected to the second power supply terminal 104 via a second current source $I_{11}$. The emitter of the n-p-n transistor Q2 is connected to the second power supply terminal 104 via a third current source $I_2$, while the emitter of the n-p-n transistor Q12 is connected to the second power supply terminal 104 via a fourth current source $I_{12}$. The emitter of each of n-p-n transistors Q1, Q2, Q11, and Q12 is connected to a comparator 105. Based on the emitter voltage difference between the n-p-n transistors Q1, Q2, Q11, and Q12, the comparator 105 can vary at least one of the first through fourth current sources $I_1$, $I_{11}$, $I_2$, and $I_{12}$.

FIG. 7 is a circuit diagram showing a concrete structure of the hysteresis comparator of FIG. 6.

The comparator 105 comprises a fifth current source $I_5$, p-n-p transistors Q3, Q13, Q4, and Q14, n-p-n transistors Q25 and Q26, and resistors $R_1$ and $R_2$. Specifically, the emitters of p-n-p transistors Q3 (a fifth transistor), Q13 (a sixth transistor), Q4 (a seventh transistor), and Q14 (an eighth transistor) are connected to each other and their connecting point is coupled with the first power supply terminal 101 via the fifth current source $I_5$. The base of the transistor Q3 is connected to the emitter of the transistor Q1, whereas the base of the transistor Q13 is connected to the emitter of the transistor Q11. The base of the transistor Q4 is connected to the emitter of the transistor Q2, whereas the base of the transistor Q14 is connected to the emitter of the transistor Q12. The collectors of the transistors Q3 and Q13 are connected to one another and their connecting point is coupled with the collector of the n-p-n transistor Q25. The collectors of the transistors Q4 and Q14 are connected to one another and their connecting point is coupled with the collector of the n-p-n transistor Q26. The transistors Q25 and Q26 have their emitters both connected to the second power supply terminal 104 and their bases connected to each other. This base connecting point is then coupled with the collector Q25's collector via the resistor $R_1$ and with the transistor Q26's collector via the resistor $R_2$.

The first current source $I_1$ is comprised of an n-p-n transistor Q21; the second current source $I_{11}$ an n-p-n transistor Q24; the third current source $I_2$ an n-p-n transistor Q22; and the fourth current source $I_{12}$ an n-p-n transistor Q23. Specifically, the bases of the transistors Q21 and Q23 are connected to the collectors of the transistors Q3, Q13, and Q25, while the bases of the transistors Q22 and Q24 are connected to the collectors of the transistors Q4, Q14, and Q26. The collector of the transistor Q21 is connected to the emitter of the transistor Q1; the collector of the transistor Q24 the emitter of the transistor Q11; the collector of the transistor Q22 the emitter of the transistor Q2; and the collector of the transistor Q23 the emitter of the transistor Q12. The emitters of the transistors Q21 and Q22 are connected to each other and their connecting point is coupled with the second power supply terminal 104 via a resistor $R_3$. The emitters of the transistors Q23 and Q24 are connected to each other and their connecting point is coupled with the second power supply terminal 104 via a resistor $R_4$.

The p-n-p transistor Q27 has its base connected to the bases of the transistors Q21 and Q23 and its collector connected to a first output terminal 106, while the p-n-p transistor Q28 has its base connected to the bases of the transistors Q22 and Q24 and its collector connected to a second output terminal 107. The transistors Q27 and Q28 have their emitters connected to each other and their connecting point is coupled with the first power supply terminal 101 via a current source $I_4$.

With this configuration, the same effect will be obtained as with the previous arrangements.

As described above, with a hysteresis comparator according to the present invention, the hysteresis width can be determined by the collector current ratio of specific transistors totally regardless of the absolute values of their collector currents. Consequently, it is possible to provide a hysteresis comparator having a stable hysteresis width. In addition, the operation of all circuit elements in their active regions makes circuit operation faster and parasitic elements unlikely to develop.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A hysteresis comparator, comprising:
   first and second input terminals for receiving first and second input signals;
   at least one output terminal;
   first and second power supply terminals;
   a first transistor having a collector coupled to said first power supply terminal, a base coupled to said first input terminal, and an emitter;
   a second transistor having a collector coupled to said first power supply terminal, a base coupled to said second input terminal, and an emitter;
   a first current source coupled between the emitter of said first transistor and said second power supply terminal;
   a second current source coupled between the emitter of said second transistor and said second power supply terminal; and
   sensing and control circuitry for sensing a difference between emitter voltages of said first and second transistors and controlling, by supplying the sensed difference to said first and second current sources, a current of at least one of said first and second current sources in accordance with the sensed difference to produce an offset voltage between said first and second input terminals.

2. The hysteresis comparator according to claim 1, wherein said sensing and control circuitry comprises:
   a third current source having a first terminal coupled to said first power supply terminal and a second terminal;
   a third transistor having a base coupled to the emitter of said first transistor, an emitter coupled to the second terminal of said third current source, and a collector;
   a fourth transistor having a base coupled to the emitter of said second transistor, an emitter coupled to the second terminal of said third current source, and a collector; and
   control means for controlling at least one of said first and second current sources based on collector currents of said third and fourth transistors.

3. The hysteresis comparator according to claim 1, wherein said sensing and control circuitry comprises:
   a third current source having a first terminal coupled to said first power supply terminal and a second terminal;
   a third transistor having a base coupled to the emitter of said first transistor, an emitter, and a collector;
   a fourth transistor having a base coupled to the emitter of said second transistor, an emitter, and a collector;
   a fifth transistor having a base coupled to the second terminal of said third current source, an emitter coupled to the emitter of said third transistor, and a collector;
   a sixth transistor having a base coupled to the second terminal of said third current source, an emitter coupled to the emitter of said fourth transistor, and a collector; and control means for controlling at least one of said first and second current sources based on collector currents of said third and fourth transistors.

4. The hysteresis comparator according to claim 1, wherein an emitter area of at least one of said first, second, third, and fourth transistors is different than emitter areas of the remaining transistors.

5. The hysteresis comparator according to claim 1, wherein said sensing and control circuitry comprises:
- a fifth current source having a first terminal coupled to said first power supply terminal and a second terminal;
- a fifth transistor having a base coupled to the emitter of said first transistor, an emitter coupled to the second terminal of said fifth current source, and a collector;
- a sixth transistor having a base coupled to the emitter of said second transistor, an emitter coupled to the second terminal of said fifth current source, and a collector;
- a seventh transistor having a base coupled to the emitter of said third transistor, an emitter coupled to the second terminal of said fifth current source, and a collector;
- an eighth transistor having a base coupled to the emitter of said fourth transistor, an emitter coupled to the second terminal of said fifth current source, and a collector; and
- control means for controlling at least one of said first, second, third, and fourth current sources based on the collector currents of said fifth, sixth, seventh, and eighth transistors.

6. The hysteresis comparator according to claim 5, wherein an emitter area of at least one of said fifth, sixth, seventh, and eighth transistors is different than emitter areas of the remaining transistors.

7. The hysteresis comparator according to claim 1, wherein said first current source comprises:
- a third transistor having a collector coupled to the emitter of said first transistor, a base coupled to said sensing and control circuitry, and an emitter coupled to said second power supply terminal through a first resistor; and
- a fourth transistor having a collector coupled to the emitter of said first transistor, a base coupled to said sensing and control circuitry, and an emitter coupled to said second power supply terminal through a second resistor; and wherein said second current source comprises:
- a fifth transistor having a collector coupled to the emitter of said second transistor, a base coupled to said sensing and control circuitry, and an emitter coupled to said second power supply terminal through said first resistor; and
- a sixth transistor having a collector coupled to the emitter of said second transistor, a base coupled to said sensing and control circuitry, and an emitter coupled to said second power supply terminal through said second resistor.

8. The hysteresis comparator according to claim 7, wherein said sensing and control circuitry comprises:
- first and second sensing and control output terminals;
- a third current source having a first terminal coupled to said first power supply terminal and a second terminal;
- a seventh transistor having a base coupled to the emitter of said first transistor, an emitter coupled to the second terminal of said third current source, and a collector coupled to said first sensing and control output terminal;
- an eighth transistor having a base coupled to the emitter of said second transistor, an emitter coupled to the second terminal of said third current source, and a collector coupled to said second sensing and control output terminal;
- a ninth transistor having a collector coupled to said first sensing and control output terminal, an emitter coupled to said second power supply terminal, and a base;
- a tenth transistor having a collector coupled to said second sensing and control output terminal, an emitter coupled to said second power supply terminal, and a base coupled to the base of said ninth transistor;
- a third resistor having a first terminal coupled to said first sensing and control output terminal and a second terminal coupled to the bases of said ninth and tenth transistors; and
- a fourth resistor having a first terminal coupled to said second sensing and control output terminal and a second terminal coupled to the bases of said ninth and tenth transistors, wherein
the bases of said third and sixth transistors are coupled to said first sensing and control output terminal and the bases of said fourth and fifth transistors are coupled to said second sensing and control output terminal.

9. The hysteresis comparator according to claim 7, wherein said sensing and control circuitry comprises:
- first and second sensing and control circuit output terminals;
- a third current source having a first terminal coupled to said first power supply terminal and a second terminal;
- a seventh transistor having a collector coupled to said first sensing and control circuit output terminal, a base coupled to the emitter of said first transistor, and an emitter;
- an eighth transistor having a collector coupled to said second sensing and control circuit output terminal, a base coupled to the emitter of said second transistor, and an emitter;
- a ninth transistor having a collector coupled to the second terminal of said third current source, a base coupled to the second terminal of said third current source, and an emitter coupled to the emitter of said seventh transistor;
- a tenth transistor having a collector coupled to the second terminal of said third current source, a base coupled to the second terminal of said third current source, and an emitter coupled to the emitter of said eighth transistor;
- an eleventh transistor having a collector, a base coupled to the second terminal of said third current source, and an emitter coupled to the emitter of said seventh transistor;
- a twelfth transistor having a collector, a base coupled to the second terminal of said third current source, and an emitter coupled to the emitter of said eighth transistor;
- a thirteenth transistor having an emitter coupled to said first power supply terminal, a collector coupled to the collector of said eleventh transistor, and a base coupled to the collector of said eleventh transistor;

a fourteenth transistor having an emitter coupled to said first power supply terminal, a collector coupled to the collector of said twelfth transistor, and a base coupled to the collector of said eleventh transistor;

a fifteenth transistor having a collector coupled to said first sensing and control output terminal, an emitter coupled to said second power supply terminal, and a base;

a sixteenth transistor having a collector coupled to said second sensing and control output terminal, an emitter coupled to said second power supply terminal, and a base coupled to the base of said fifteenth transistor;

a third resistor having a first terminal coupled to said first sensing and control output terminal and a second terminal coupled to the bases of said fifteenth and sixteenth transistors; and a fourth resistor having a first terminal coupled to said second sensing and control output terminal and a second terminal coupled to the bases of said fifteenth and sixteenth transistors, wherein the bases of said third and sixth transistors are coupled to said first sensing and control output terminal and the bases of said fourth and fifth transistors are coupled to said second sensing and control output terminal.

10. The hysteresis comparator according to claim 9, further comprising:

a seventeenth transistor having a base coupled to the collectors of said twelfth and fourteenth transistors, an emitter coupled to said first power supply terminal and a collector coupled to an output terminal.

11. A hysteresis comparator, comprising:

first and second input terminals for receiving first and second input signals;

at least one output terminal;

first and second power supply terminals;

a first transistor having a collector coupled to said first power supply terminal, a base coupled to said first input terminal, and an emitter;

a second transistor having a collector coupled to said first power supply terminal, a base coupled to said first input terminal, and an emitter;

a third transistor having a collector coupled to said first power supply terminal, a base coupled to said second input terminal, and an emitter;

a fourth transistor having a collector coupled to said first power supply terminal, a base coupled to said second input terminal, and an emitter;

a first current source coupled between the emitter of said first transistor and said second power supply terminal;

a second current source coupled between the emitter of said second transistor and said second power supply terminal;

a third current source coupled between the emitter of said third transistor and said second power supply terminal;

a fourth current source coupled between the emitter of said fourth transistor and said second power supply terminal; and sensing and control circuitry for sensing differences between emitter voltages of said first, second, third, and fourth transistors and controlling, by supplying the sensed differences to said first, second, third and fourth current sources, a current of at least one of said first, second, third, and fourth current sources in accordance with the sensed differences to produce an offset voltage between said first and second input terminals.

12. A hysteresis comparator, comprising:

first and second input terminals for receiving first and second input signals;

first and second output terminals;

first and second power supply terminals;

a first transistor having a collector coupled to said first power supply terminal, a base coupled to said first input terminal, and an emitter;

a second transistor having a collector coupled to said first power supply terminal, a base coupled to said first input terminal, and an emitter;

a third transistor having a collector coupled to said first power supply terminal, a base coupled to said second input terminal, and an emitter;

a fourth transistor having a collector coupled to said first power supply terminal, a base coupled to said second input terminal, and an emitter;

a first current source coupled between the emitter of said first transistor and said second power supply terminal, said first current source comprising a fifth transistor having a collector coupled to the emitter of said first transistor, a base, and an emitter coupled to said second power supply terminal through a first resistor;

a second current source coupled between the emitter of said second transistor and said second power supply terminal, said second current source comprising a sixth transistor having a collector coupled to the emitter of said second transistor, a base, and an emitter coupled to said second power supply terminal through a second resistor;

a third current source coupled between the emitter of said third transistor and said second power supply terminal, said third current source comprising a seventh transistor having a collector coupled to the emitter of said third transistor, a base, and an emitter coupled to said second power supply terminal through said first resistor;

a fourth current source coupled between the emitter of said fourth transistor and said second power supply terminal, said fourth current source comprising an eighth transistor having a collector coupled to the emitter of said fourth transistor, a base, and an emitter coupled to said second power supply terminal through said second resistor;

a fifth current source having a first terminal coupled to said first power supply terminal and a second terminal;

a ninth transistor having a collector coupled to said first output terminal, a base, and an emitter coupled to the second terminal of said fifth current source;

a tenth transistor having a collector coupled to said second output terminal, a base, and an emitter coupled to the second terminal of said fifth current source; and sensing and control circuitry coupled to the bases of said fifth, sixth, seventh, eighth, ninth, and tenth transistors for sensing differences between emitter voltages of said first, second, third, and fourth transistors and controlling a current of at least one of said first, second, third, and fourth current sources in accordance with the sensed differences to produce an offset voltage between said first and second input terminals.

13. The hysteresis comparator according to claim 12, wherein said sensing and control circuitry comprises:
   first an second sensing and control output terminals;
   a sixth current source having a first terminal coupled to said first power supply terminal and a second terminal;
   an eleventh transistor having a base coupled to the emitter of said first transistor, an emitter coupled to the second terminal of said sixth current source, and a collector coupled to said first sensing and control output terminal;
   a twelfth transistor having a base coupled to the emitter of said third transistor, an emitter coupled to the second terminal of said sixth current source, and a collector coupled to said second sensing and control output terminal;
   a thirteenth transistor having a base coupled to the emitter of said second transistor, an emitter coupled to the second terminal of said sixth current source, and a collector coupled to said first sensing and control output terminal;
   a fourteenth transistor having a base coupled to the emitter of said fourth transistor, an emitter coupled to the second terminal of said sixth current source, and a collector coupled to said second sensing and control output terminal;
   a fifteenth transistor having a collector coupled to said first sensing and control output terminal, an emitter coupled to said second power supply terminal, and a base;
   a sixteenth transistor having a collector coupled to said second sensing and control output terminal, an emitter coupled to said second power supply terminal, and a base coupled to the base of said fifteenth transistor;
   a third resistor having a first terminal coupled to said first sensing and control output terminal and a second terminal coupled to the bases of said fifteenth and sixteenth transistors; and
   a fourth resistor having a first terminal coupled to said second sensing and control output terminal and a second terminal coupled to the bases of said fifteenth and sixteenth transistors, wherein,
   the bases of said fifth, eighth, and tenth transistors are coupled to said first sensing and control output terminal and the bases of said sixth, seventh, and ninth transistors are coupled to said second sensing and control output terminal.

14. The hysteresis comparator according to claim 12, wherein an emitter area of said first transistor is different than an emitter area of said second transistor.

15. The hysteresis comparator according to claim 12, wherein an emitter area of said first transistor is different than an emitter area of said second transistor and the emitter area of said second transistor is equal to an emitter area of said eleventh transistor.

16. The hysteresis comparator according to claim 12, wherein an emitter area of said third transistor is different than an emitter area of said fourth transistor.

17. The hysteresis comparator according to claim 12, wherein an emitter area of said third transistor is different than an emitter area of said fourth transistor and wherein the emitter area of said fourth transistor is equal to an emitter area of said twelfth transistor.

18. A hysteresis comparator, comprising:
   first and second input terminals for receiving first and second input signals;
   first and second output terminals;
   first and second power supply terminals;
   a first transistor having a collector coupled to said first power supply terminal, a base coupled to said first input terminal, and an emitter;
   a second transistor having a collector coupled to said first power supply terminal, a base coupled to said second input terminal, and an emitter;
   a first current source coupled between the emitter of said first transistor and said second power supply terminal, said first current source comprising (1) a third transistor having a collector coupled to the emitter of said first transistor, a base, and an emitter coupled to said second power supply terminal through a first resistor and (2) a fourth transistor having a collector coupled to the emitter of said first transistor, a base, and an emitter coupled to said second power supply terminal through a second resistor;
   a second current source coupled between the emitter of said second transistor and said second power supply terminal, said second current source comprising (1) a fifth transistor having a collector coupled to the emitter of said second transistor, a base, and an emitter coupled to said second power supply terminal through said first resistor and (2) a sixth transistor having a collector coupled to the emitter of said second transistor, a base, and an emitter coupled to said second power supply terminal through said second resistor;
   a seventh transistor having a collector coupled to said first output terminal, a base, and an emitter coupled to said second power supply terminal through a third resistor;
   an eighth transistor having a collector coupled to said second output terminal, a base, and an emitter coupled to said second power supply terminal through said third resistor; and
   sensing and control circuitry coupled to the bases of said third, fourth, fifth, sixth, seventh, and eighth transistors for sensing differences between emitter voltages of said first and second transistors and controlling a current of at least one of said first and second current sources in accordance with the sensed differences to produce an offset voltage between said first and second input terminals.

19. The hysteresis comparator according to claim 18, wherein said sensing and control circuitry comprises:
   first and second sensing and control output terminals;
   a third current source having a first terminal coupled to said first power supply terminal and a second terminal;
   a ninth transistor having a base coupled to the emitter of said first transistor, an emitter coupled to the second terminal of said third current source, and a collector coupled to said first sensing and control output terminal;
   a tenth transistor having a base coupled to the emitter of said second transistor, an emitter coupled to the second terminal of said third current source, and a collector coupled to said second sensing and control output terminal;
   an eleventh transistor having a collector coupled to the said first sensing and control output terminal, an emitter coupled to the said second power supply terminal, and a base;
   a twelfth transistor having a collector coupled to said second sensing and control output terminal, an emitter coupled to said second power supply terminal, and a base coupled to the base of said eleventh transistor;

a fourth resistor having a first terminal coupled to said first sensing and control output terminal and a second terminal coupled to the bases of said eleventh and twelfth transistors; and a fifth resistor having a first terminal coupled to said second sensing and control output terminal and a second terminal coupled to the bases of said eleventh and twelfth transistors, wherein the bases of said third, sixth, and seventh transistors are coupled to said first sensing and control output terminal and the bases of said fourth, fifth, and eighth transistors are coupled to said second sensing and control output terminal.

20. The hysteresis comparator according to claim 18, wherein an emitter area of said third transistor is different than an emitter area of said fourth transistor.

21. The hysteresis comparator according to claim 18, wherein an emitter area of said fifth transistor is different than an emitter area of said sixth transistor.

* * * * *